United States Patent
Qu

(10) Patent No.: US 12,085,916 B2
(45) Date of Patent: Sep. 10, 2024

(54) METHOD AND DEVICE FOR PROCESSING WAFER DETECTION TASKS, SYSTEM, AND STORAGE MEDIUM

(71) Applicant: CHANGXIN MEMORY TECHNOLOGIES, INC., Hefei (CN)

(72) Inventor: Deqing Qu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 498 days.

(21) Appl. No.: 17/400,431

(22) Filed: Aug. 12, 2021

(65) Prior Publication Data

US 2022/0083024 A1 Mar. 17, 2022

Related U.S. Application Data

(63) Continuation of application No. PCT/CN2021/097390, filed on May 31, 2021.

(30) Foreign Application Priority Data

Sep. 11, 2020 (CN) .......................... 202010955527.5

(51) Int. Cl.
*G05B 19/4093* (2006.01)
*G05B 19/406* (2006.01)

(52) U.S. Cl.
CPC ..... *G05B 19/40937* (2013.01); *G05B 19/406* (2013.01); *G05B 2219/45031* (2013.01)

(58) Field of Classification Search
CPC ............ G05B 19/406; G05B 19/40937; G05B 2219/45031

USPC ......................................................... 700/121
See application file for complete search history.

(56) References Cited

U.S. PATENT DOCUMENTS

| 9,378,993 | B2 | 6/2016 | Hosaka |
| 10,825,650 | B2 | 11/2020 | Chou et al. |
| 2014/0299277 | A1 | 10/2014 | Hosaka |
| 2017/0353536 | A1* | 12/2017 | Shraer .................. G06F 9/5066 |

(Continued)

FOREIGN PATENT DOCUMENTS

| CN | 103946966 A | 7/2014 |
| CN | 103365726 B | 5/2016 |

(Continued)

OTHER PUBLICATIONS

Supplementary European Search Report in European application No. 21769327.4, mailed on May 27, 2022, 10 pgs.

(Continued)

*Primary Examiner* — Jigneshkumar C Patel
(74) *Attorney, Agent, or Firm* — Syncoda LLC; Feng Ma

(57) ABSTRACT

A method and device for processing wafer detection tasks, a system, and a storage medium. The method includes that: the resource manager node receives the wafer detection task from the storage server, selects the target work node from the plurality of work nodes according to weight values of the work nodes connected to the resource manager node, and allocates the wafer detection task to the target work node. The target work node selects the idle GPU from the resource pool and allocates the wafer detection task to the idle GPU for execution. The GPU preprocesses the wafer map in the wafer detection task and inputs the processed wafer map into the wafer detection model to obtain the detection result.

17 Claims, 8 Drawing Sheets

(56) References Cited

U.S. PATENT DOCUMENTS

2018/0341525 A1 11/2018 Gupta et al.
2020/0105500 A1 4/2020 Chou et al.
2021/0263505 A1* 8/2021 Zheng .................... G06N 3/086

FOREIGN PATENT DOCUMENTS

| CN | 108933822 A | 12/2018 |
| CN | 105900064 B | 5/2019 |
| CN | 108933822 B | 10/2019 |
| CN | 110969598 A | 4/2020 |

OTHER PUBLICATIONS

International Search Report in the international application No. PCT/CN2021/097390, mailed on Aug. 4, 2021, 2 pgs.

* cited by examiner

METHOD AND DEVICE FOR PROCESSING WAFER DETECTION TASKS, SYSTEM, AND STORAGE MEDIUM

CROSS-REFERENCE TO RELATED APPLICATION

This is a continuation of International Application No. PCT/CN2021/097390, filed on May 31, 2021 and entitled "METHOD AND DEVICE FOR PROCESSING WAFER DETECTION TASKS, SYSTEM, AND STORAGE MEDIUM", which claims priority to Chinese patent application No. 202010955527.5, filed to the China National Intellectual Property Administration on Sep. 11, 2020 and entitled "METHOD AND DEVICE FOR PROCESSING WAFER DETECTION TASKS, SYSTEM, AND STORAGE MEDIUM". The content of International Application No. PCT/CN2021/097390 and Chinese patent application No. 202010955527.5 are herein incorporated by reference in their entireties.

TECHNICAL FIELD

The present disclosure relates to the technical field of information processing, in particular to a method and device for processing wafer detection tasks, a system, and a storage medium.

BACKGROUND

A wafer is a basic raw material for manufacturing a semiconductor device. A semiconductor with extremely high purity is prepared into the wafer through processes such as crystal pulling and slicing. The wafer forms an extremely tiny circuit structure through a series of semiconductor manufacturing processes, and then becomes a chip through cutting, packaging and testing. The chip is widely applied to various electronic devices.

In the case of mass production of the wafer, appearance detection depending on manpower is impossible to complete, therefore, a wafer appearance detection device is often used for quality detection at present. An intelligent defect detection algorithm based on depth learning of the wafer appearance detection device can effectively improve the wafer detection accuracy, compared with a related image recognition detection algorithm.

However, the algorithm based on depth learning is relatively high in complexity. The wafer appearance detection device depending on a Central Processing Unit (CPU) to provide computing power cannot meet a real-time requirement of wafer defect detection. Particularly, in the case that the production capacity of a factory is continuously improved, a large number of wafer maps are detected every day, and the current device is limited in detection capability and low in detection efficiency.

SUMMARY

In a first aspect, an embodiment of the present disclosure provides a method for processing wafer detection tasks, applied to a resource manager node connected to a plurality of work nodes, the method including:

receiving a wafer detection task from a storage server, herein the wafer detection task includes at least one wafer map;

determining, according to weight values of the work nodes, a target work node, herein the target work node is a work node with a greatest weight value in the plurality of work nodes, and a weight value of each of the work nodes is a parameter, determined according to load information of each of the work nodes, for allocating the wafer detection tasks; and sending the wafer detection task to the target work node.

In a second aspect, an embodiment of the present disclosure provides a device for processing wafer detection tasks, including:

at least one processor, and
a memory in communication connection with the at least one processor, wherein
the memory stores instructions executable by the at least one processor, which, when being executed by the at least one processor, cause the device to execute any method in the first aspect.

In a third aspect, an embodiment of the present disclosure provides a system for wafer detection, including:

at least one resource manager node, and a plurality of work nodes connected to the resource manager node, herein each of the work nodes includes a plurality of Graphics Processing Units (GPUs); and wherein the resource manager node is configured to execute any method in the first aspect.

DETAILED DESCRIPTION

Figure 1:
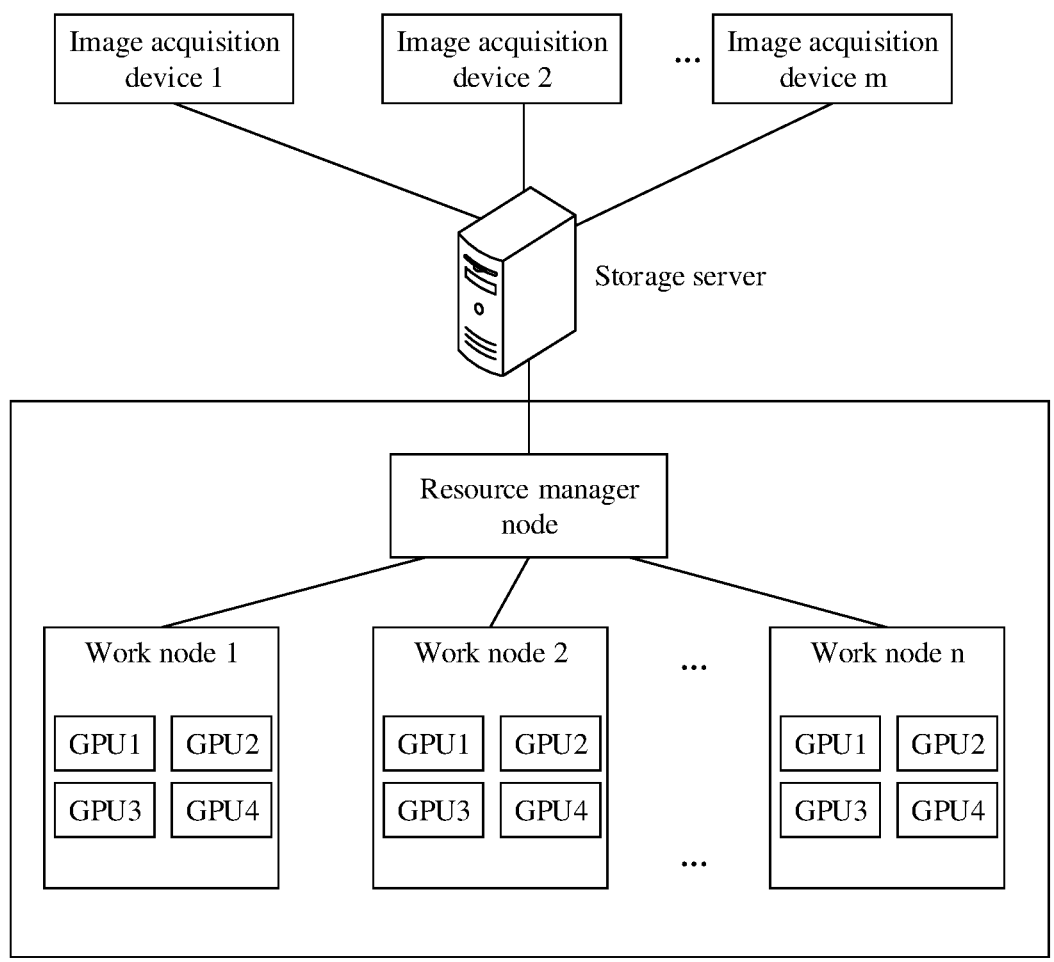
FIG. 1 is an architecture schematic diagram of a system for wafer detection provided by an embodiment of the present disclosure.

Technical solutions in embodiments of the present disclosure will be clearly and completely described below in combination with the accompanying drawings in the embodiments of the present disclosure. Apparently, the described embodiments are only a part of the embodiments of the present disclosure and not all the embodiments. Based on the embodiments in the present disclosure, all other embodiments obtained by those skilled in the art without involving any inventive effort fall within the scope of protection of the present disclosure.

The terms "first", "second", etc. in the specification and claims of the present disclosure and in the above drawings are used for distinguishing similar objects and not necessarily for describing a specific sequence or sequential order. It is to be understood that such used data may be interchangeable where appropriate, so that the embodiments of the present disclosure described herein are, for example, capable of being implemented in a sequence other than those illustrated or described herein.

Furthermore, the terms "include" and "having", as well as any variations thereof, are intended to cover a non-exclusive inclusion, for example, a process, a method, a system, a product, or a device that includes a series of steps or elements and is not necessarily limited to those expressly listed steps or elements, but may contain other steps or elements not expressly listed or inherent to such process, method, product, or device.

The technical solutions provided by the embodiments of the present disclosure relate to the field of semiconductor wafer production, in particular to the field of defect detection in a wafer production procedure.

Chip (that is, an integrated circuit) industry is the strategic, fundamental and leading industry of national economic and social development and plays a key role in several major fields, for example, a computer, consumer electronics, network communication, automotive electronics, etc. A production and manufacturing process of the chip is very complex, a wafer is main material for manufacturing the chip, and a surface defect thereof is a main obstacle influencing the product yield. By detecting the surface defect of the wafer, not only a defective crystal grain may be found, but also a fault existing in a process flow may be determined according to a distribution mode of the defective crystal grain, so that an engineer may improve the process.

At present, wafer defect detection is mainly divided into two types, one is to detect electrical performance of the crystal grain through probe testing, and the other is to detect the surface defect of the wafer through manual visual detection. Both two manners require an experienced engineer to analyze and determine, consume manpower, are high in labor intensity, and are liable to occur an error. In the case that the production capacity of a factory is continuously improved, the detection efficiency through a manual manner is low.

As a detection technology is continuously developed, a detection method based on image recognition appears. The detection method can improve the wafer detection efficiency and accuracy to some extent. The detection method mainly includes the following steps that: feature extraction is performed on a wafer map first, then an extracted feature is input into a machine learning model for judgment, and wafer defects of the wafer map is classified and recognized. Subsequently, a detection method based on depth learning appears. Depth learning is the most popular machine learning method at present, which needs a large amount of training data, and can further improve the wafer detection accuracy and reduce the false alarm rate compared with the detection method based on image recognition. However, the detection method based on depth learning is relatively high in algorithm complexity. The device depending on a CPU to provide the computing power cannot meet a real-time requirement of the algorithm. As the production capacity of the factory is improved, a large number of wafer maps are produced by a detection machine every day, and the current device is limited in detection capability and low in detection efficiency.

Aiming at the technical problems, an embodiment of the present disclosure provides a distributed solution based on a GPU cluster. The detection of the wafer map is scattered to a GPU of each of the work nodes in a cluster for execution, the throughput of intelligent defect detection is improved, and the real-time requirement for performing the intelligent defect detection on a large number of wafer maps is met. Hardware acceleration is performed on a wafer intelligent defect detection procedure by using high computing power of the GPU, and delay is reduced. In addition, an embodiment of the present disclosure further provides a distributed system architecture based on the GPU cluster. Aiming at a characteristic of wafer intelligent defect detection, through a customized GPU cluster scheduling algorithm, the resource utilization rate of the GPU is optimized, and the throughput of the wafer intelligent defect detection is improved.

Before the method for processing wafer detection tasks provided by the embodiment of the present disclosure is introduced, the system architecture of the method is briefly introduced.

FIG. 1 is an architecture schematic diagram of a system for wafer detection provided by an embodiment of the present disclosure. As shown in FIG. 1, the wafer detection system provided by the embodiment of the present disclosure includes a plurality of image acquisition devices, a storage server, at least one resource manager node (FIG. 1 shows one resource manager node), and a plurality of work nodes. Each image acquisition device is connected to the storage server, the storage server is connected to the resource manager node, and a resource manager server is respectively connected to the plurality of work nodes. Each of the work nodes includes a plurality of GPUs, and the GPU is configured to actually execute the wafer detection task.

The image acquisition device is configured to acquire a map of each wafer on a production line, and the image acquisition device stores the acquired wafer map on the storage server. As an example, the image acquisition device may be set on a detection machine table of the production line.

The storage server of the embodiment is configured to store the wafer maps from different image acquisition devices and trigger the GPU cluster to perform the intelligent defect detection on the wafer map. The GPU cluster includes the Resource Manager Node (RMN for short) and the Work Node (WN for short). The resource manager node is responsible for scheduling the wafer detection task, and the work node is responsible for executing the wafer detection task.

In an embodiment of the present disclosure, the storage server sends the wafer detection task to the resource manager node. Through a two-stage scheduling algorithm, the wafer detection task is issued to the GPU which actually executes the task. Specifically, the resource manager node allocates the wafer detection task to the work node, and then the work node allocates the wafer detection task to the GPU.

In an embodiment of the present disclosure, the resource manager node may allocate the wafer detection task to the work node by adopting a polling algorithm based on dynamic weight, and periodically check a health state of each of the work nodes connected to the resource manager node.

Figure 2:
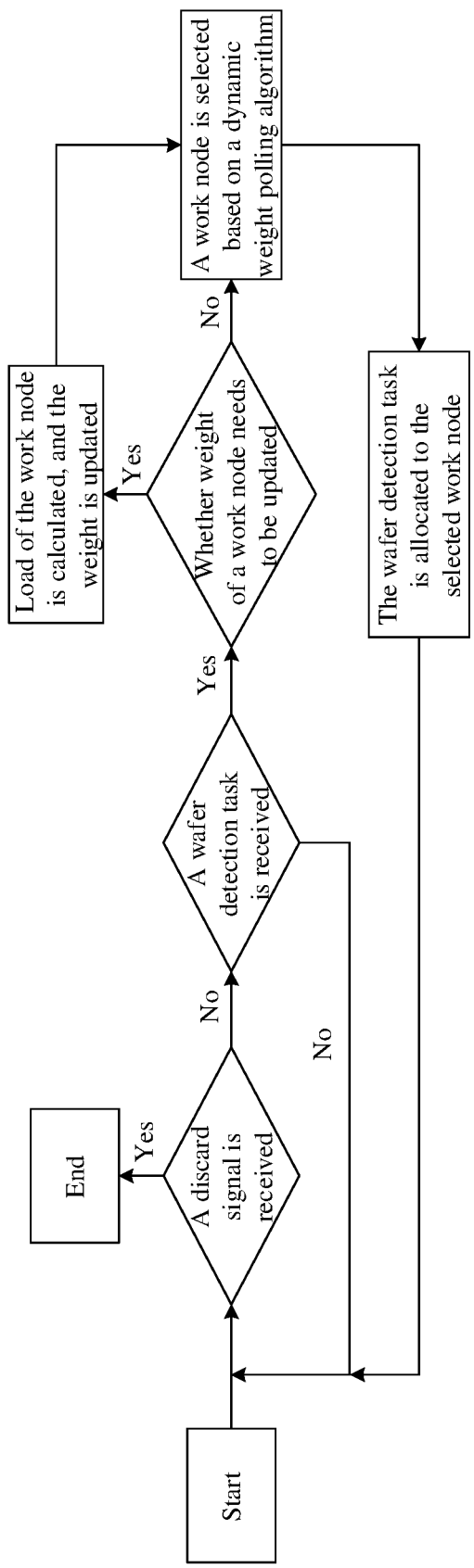
FIG. 2 is an execution flowchart of a resource manager node provided by an embodiment of the present disclosure.

Exemplarily, FIG. 2 is an execution flowchart of a resource manager node provided by an embodiment of the present disclosure. As shown in FIG. 2, after receiving the wafer detection task from the storage server, the resource manager node first determines whether the weight of the work node needs to be updated, calculates the load of the work node and updates the weight of the work node if the weight of the work node needs to be updated, selects a work node from the plurality of work nodes based on the updated weight, and allocates the wafer detection task to the selected work node.

As an example, the resource manager node may periodically update the weight of the work node, for example, update every 5 minutes. As an example, the resource manager node may update the weight of the work node responsive to that load information reported by the work node is received (typically, responsive to that the load information of the work node is changed). The load information of the work node may be a load value of the work node (representing the load magnitude of the work node), and may also be an operating parameter set of the work node. The operating parameter set includes at least one of the following: a utilization rate of a CPU of the work node, an available memory of the CPU of the work node, a utilization rate of each GPU of the work node, or an available video memory of each GPU of the work node.

In an embodiment of the present disclosure, the work node includes a plurality of GPUs. The wafer detection task is allocated to an idle GPU by a maintaining task queue and a resource pool. The task queue is responsible for maintaining the wafer detection tasks needing to be executed, and the wafer detection tasks are executed in the task queue according to a first-in first-out sequence. The resource pool is responsible for maintaining the GPU in an idle/busy state, and the resource pool includes the idle GPU.

Figure 3:
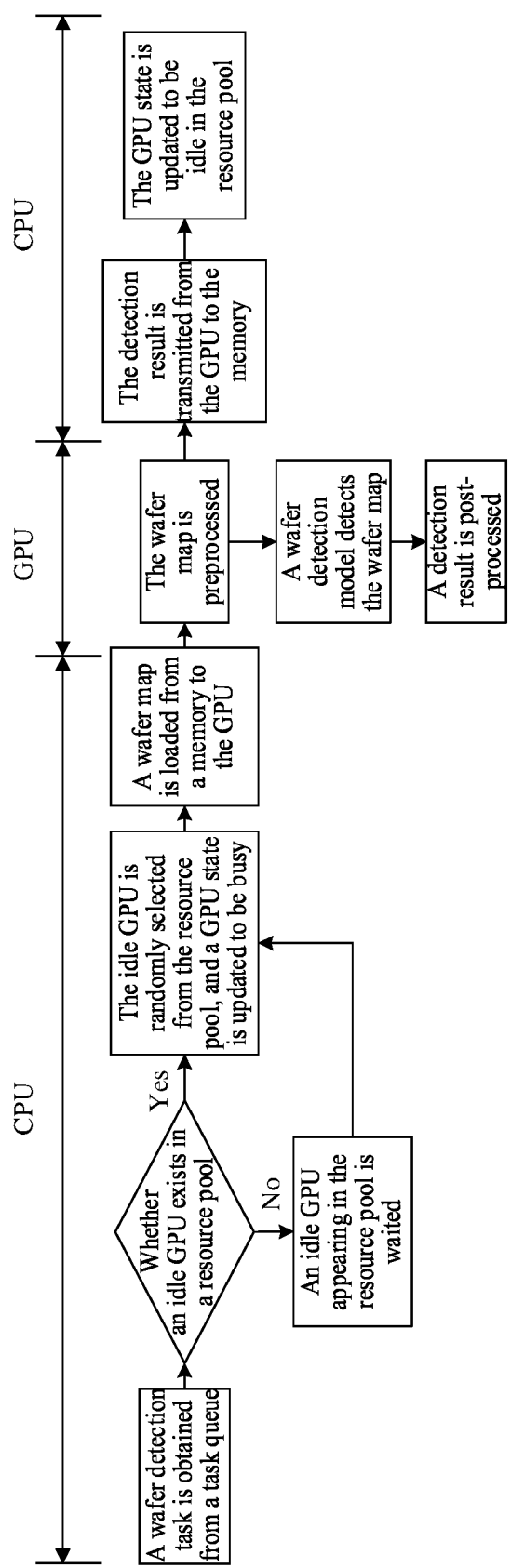
FIG. 3 is an execution flowchart of a work node provided by an embodiment of the present disclosure.

Exemplarily, FIG. 3 is an execution flowchart of a work node provided by an embodiment of the present disclosure. As shown in FIG. 3, the work node includes two parts: the CPU and the GPU. An execution process of the work node runs on two hardware devices: the CPU and the GPU. The CPU part is responsible for scheduling the wafer detection task from the work node to the GPU, and the wafer detection tasks are executed according to the first-in first-out sequence. The GPU part is responsible for a defect detection task of the wafer map in the wafer detection task. The defect detection task includes preprocessing of the wafer map, the wafer defect detection based on a wafer detection model and post-processing of a detection result. As an example, the detection result includes a tag value for indicating whether a wafer defect exists in the wafer map, a plurality of defect categories, confidence corresponding to each defect category, and a defect position. The post-processing of the detection result may be to remove the defect category with relatively low confidence, and only reserve a defect category with the highest confidence and a defect position of the defect category.

As an example, the work node obtains the wafer detection task from the task queue and determines whether an idle GPU exists in the resource pool. If the idle GPU exists in the resource pool, the work node randomly selects one idle GPU from the resource pool, allocates the wafer detection task to the idle GPU, meanwhile, updates a GPU state to be busy, and updates the GPU state to be idle after the wafer detection task is executed. If no idle GPU exists in the resource pool, waiting is performed until an idle GPU appears in the resource pool.

As an example, a wafer detection model is preset in the GPU. The model may be obtained by training based on an arbitrary depth learning model. A large amount of computing resources are consumed for detecting the defect in the wafer map by using the wafer detection model. Through hardware acceleration performed on the GPU, compared with the CPU, performance improvement may reach more than 10 times, and the real-time requirement of the wafer detection is met.

The above describes an information processing procedure based on the system architecture shown in FIG. 1 on the whole. The technical solution of the present disclosure is described below in detail with specific embodiments. The following specific embodiments may be combined, and the same or similar concepts or procedures may not be repeated in some embodiments.

Figure 4:
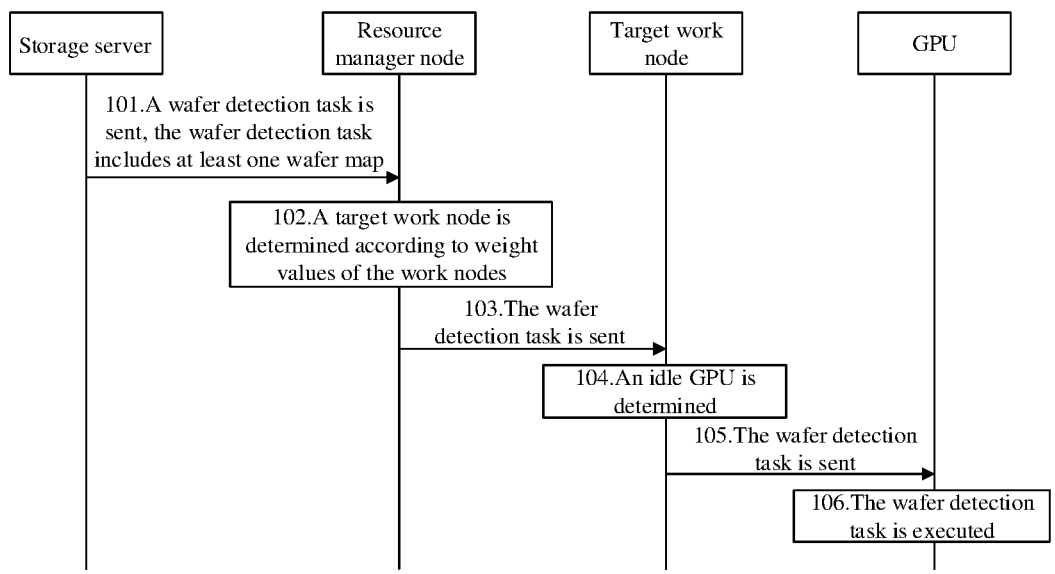
FIG. 4 is an interactive schematic diagram of a method for processing wafer detection tasks provided by an embodiment of the present disclosure.

FIG. 4 is an interactive schematic diagram of a method for processing wafer detection tasks provided by an embodiment of the present disclosure. As shown in FIG. 4, the method provided by the embodiment includes the following operations.

In S101, a storage server sends a wafer detection task to a resource manager node, the wafer detection task includes at least one wafer map.

The storage server may be connected to one resource manager node and may also be connected to a plurality of resource manager nodes. The operations of the embodiment are introduced by taking one resource manager node as an example.

In some embodiments, the storage server may simultaneously send different wafer detection tasks to a plurality of resource manager nodes, and each resource manager node is responsible for allocating a received wafer detection task to a work node connected to the resource manager node.

Optionally, the storage server may be a network storage server, for example, a Network Attached Storage (NAS for short) server.

In S102, the resource manager node determines a target work node according to weight values of the work nodes.

The target work node is a work node with a greatest weight value in the plurality of work nodes, and a weight value of each of the work nodes is a parameter, determined according to load information of each of the work nodes, for allocating the wafer detection tasks.

Load information of the work node may be a load value. The load value indicates a load magnitude of the work node in a preset time period. The load information may also be an operating parameter for indicating load condition of the work node. The operating parameter includes at least one of a CPU utilization rate of the work node, an available memory of the work node, GPU utilization rates of a plurality of GPUs, or available video memories of the plurality of GPUs. The available memory refers to the available memory of the CPU, and the available video memory refers to the available video memory of the GPU.

The greater the weight value of the work node is, the higher the probability that the wafer detection task is allocated to is. The smaller the weight value of the work node is, the lower the probability that the wafer detection task is allocated to is. If the weight value of the work node is 0, the work node cannot be allocated to the wafer detection task.

Optionally, the weight value of the work node may be set by default as the number of the GPU of the work node, and represented as a formula $w_x = N_{GPU}^x$, where $x \in (1, 2, \ldots, n)$, n is a positive integer greater than or equal to 2, and n corresponds to the number of the work node in FIG. 1.

In S103, the resource manager node sends the wafer detection task to the target work node.

In S104, the target work node determines an idle GPU.

In S105, the target work node sends the wafer detection task to the GPU.

The target work node receives the wafer detection task sent by the resource manager node, determines whether an idle GPU exists in a resource pool or not, and allocates the wafer detection task to the idle GPU if the idle GPU exists in the resource pool. If no idle GPU exists in the resource pool, an idle GPU appearing in the resource pool is waited, and then the wafer detection task is allocated to the idle GPU.

As an example, if a plurality of idle GPUs exist in the resource pool, the target work node may randomly allocate the wafer detection task to one of the idle GPUs. As another example, if a plurality of idle GPUs exist in the resource pool, the target work node may allocate the wafer detection task to an idle GPU with the greatest video memory according to the magnitudes of the video memories of the GPUs.

In S106, the GPU executes the wafer detection task.

The GPU receives the wafer detection task sent by the work node and preprocesses a wafer map in the wafer detection task first to obtain a processed wafer map. The preprocessing includes at least one of rotation, clipping, scaling, or numerical normalization of the wafer map. Numerical normalization refers to that an RGB value and position information of each pixel of the wafer map are normalized to be between [0, 1]. Normalization to [0, 1] has the advantage that data values (RGB values, positions) of different dimensions may be compared through the same measurement unit, so that a contribution value of each feature to a result is the same. The processed wafer map meets a requirement of the input map by a wafer detection model.

The processed wafer map is input into a pre-trained wafer detection model to obtain a detection result. The wafer detection model is obtained through training by adopting an arbitrary depth learning model. The detection result output by the model includes: at least one of a tag for indicating whether a wafer defect exists in the wafer map, a defect category, or a defect position.

Exemplarily, the tag may be a tag value, for example, 0 represents that no wafer defect exists in the wafer map, and 1 represents that the wafer defect exists in the wafer map. The defect category may be indicated by an ID of the defect category. Exemplarily, the wafer defect includes a scratch defect, a grain defect, poor plating, poor edge coverage, etc. The defect position indicates a region of the wafer defect. The region may be a rectangular region, and correspondingly, the rectangular region may be represented by diagonal vertex coordinates or four vertex coordinates.

Optionally, the detection result further includes confidence (which may be understood as a probability value) corresponding to the defect category.

According to the method for processing wafer detection tasks provided by the embodiment, the resource manager node receives the wafer detection task from the storage server, selects the target work node from the plurality of work nodes according to weight values of the work nodes connected to the resource manager node, and allocates the wafer detection task to the target work node. The target work node selects the idle GPU from the resource pool and allocates the received wafer detection task to the idle GPU for execution. The GPU preprocesses the wafer map in the wafer detection task and inputs the processed wafer map into the wafer detection model to obtain the detection result. Through the above two-stage task scheduling, the wafer detection tasks are scattered to the GPUs of the work nodes for execution, load balance between the work nodes and between the GPUs is realized, a real-time requirement for performing defect detection on a large number of wafer maps may be met, and the throughput for processing the wafer detection task by the system is improved.

Figure 5:
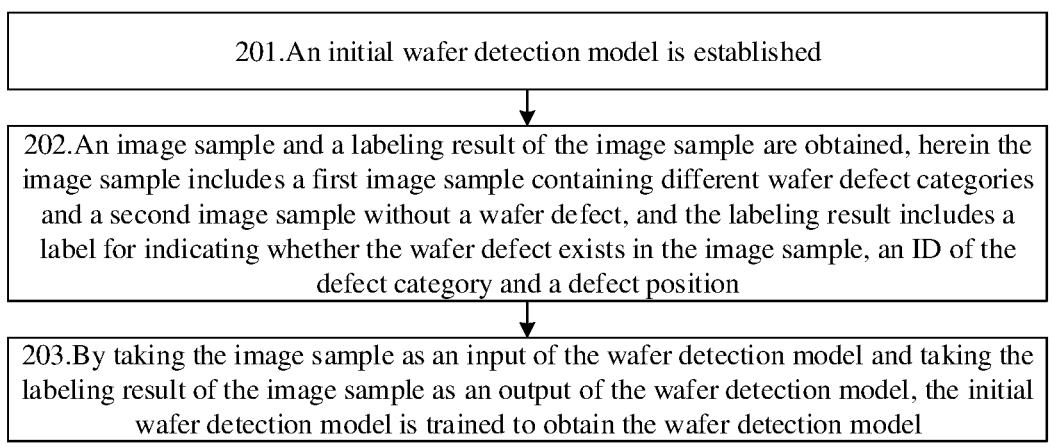
FIG. 5 is a schematic diagram of a method for training wafer detection model provided by an embodiment of the present disclosure.

In the above embodiments, each GPU of the work node includes the wafer detection model. A training procedure of the wafer detection model is briefly described below in combination with the drawings. Exemplarily, FIG. 5 is a flowchart of a wafer detection model training procedure provided by an embodiment of the present disclosure. As shown in FIG. 5, a method for training wafer detection model includes the following operations.

In S201, an initial wafer detection model is established.

In S202, an image sample and a labeling result of the image sample are obtained, herein the image sample includes a first image sample containing different wafer defect categories and a second image sample without a wafer defect, and the labeling result includes a label for indicating whether the wafer defect exists in the image sample, an ID of the defect category and a defect position.

In the embodiment, the first image sample includes wafer maps of different photographing angles, different wafer defect categories, different wafer defect positions, different surfaces (a front surface and a back surface of a wafer), and different environment conditions (for example, an illumination condition, a temperature environment, a humidity environment, etc.). Similarly, the second image sample includes wafer maps without the wafer defect of different photographing angles, different surfaces, and different environment conditions.

In S203, by taking the image sample as an input of the wafer detection model and taking the labeling result of the image sample as an output of the wafer detection model, the initial wafer detection model is trained to obtain the wafer detection model.

The GPU of the embodiment adopts the wafer detection model to perform the defect detection on wafer map, so that the detection accuracy and the detection efficiency may be greatly improved.

Figure 6:
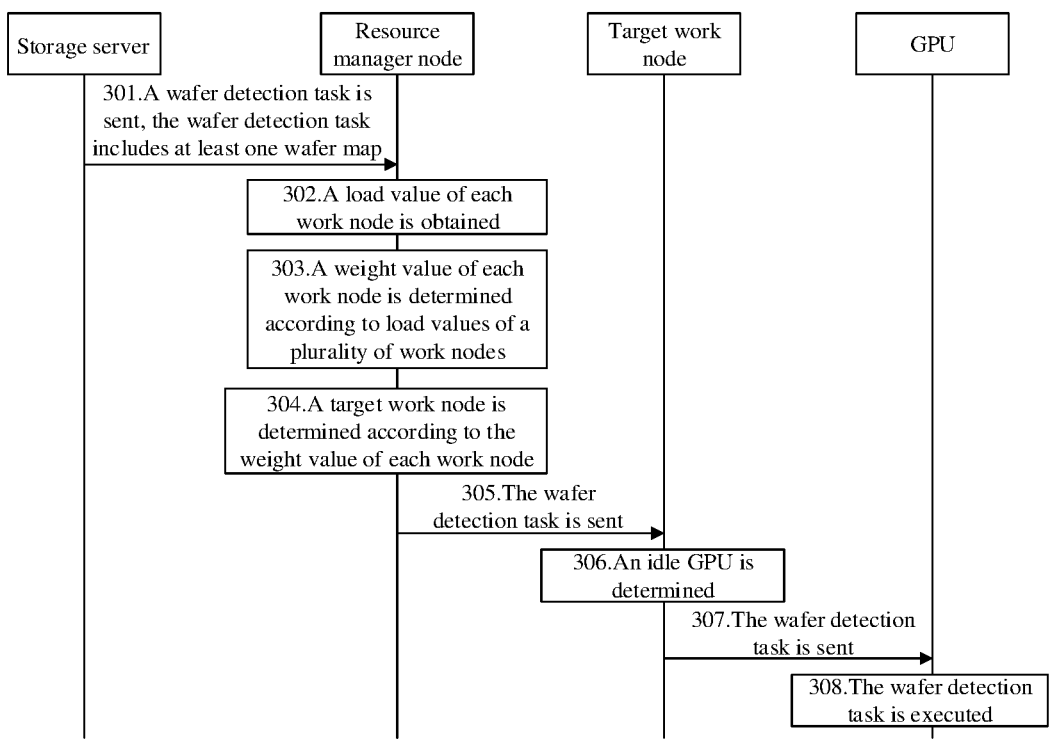
FIG. 6 is an interactive schematic diagram of a method for processing wafer detection tasks provided by an embodiment of the present disclosure.

Based on the above embodiments, the method for processing wafer detection tasks is described below in detail in combination with the drawings. Exemplarily, FIG. 6 is an interactive schematic diagram of a method for processing wafer detection tasks provided by an embodiment of the present disclosure. As shown in FIG. 6, the method provided by the embodiment of the present disclosure includes the following operations.

In S301, a storage server sends a wafer detection task to a resource manager node, the wafer detection task includes at least one wafer map.

In S302, the resource manager node obtains a load value of each of the work nodes, the load value indicates a load magnitude of the work node in a preset time period.

In an embodiment of the present disclosure, the above S302 includes that: the resource manager node receives an operating parameter set from each of the work nodes, and determines the load value of each of the work nodes according to the operating parameter set of the work node. The operating parameter set includes GPU utilization rates of a plurality of GPUs of the work node, available video memories of the plurality of GPUs of the work node, a CPU utilization rate of the work node, and an available memory of the work node.

The resource manager node may receive the operating parameter set from the work node in the following several manners.

In a possible implementation, the resource manager node periodically receives the operating parameter set from each of the work nodes.

Optionally, the resource manager node may periodically send a query request to a plurality of work nodes. The query request is configured to request a current operating state of the work node. Each of the work nodes sends a query response to the resource manager node in response to the query request. The query response includes a current operating parameter set of the work node.

Optionally, the resource manager node and the work node agree on a reporting period of the operating parameter set, and each of the work nodes actively reports the operating parameter set to the resource manager node according to the reporting period.

In a possible implementation, responsive to start or end of execution of a wafer detection task for each of the work nodes, the resource manager node receives the operating parameter set from the work node. For example, the work node 1 allocates the wafer detection task to the GPU 1, and when the GPU 1 starts executing the wafer detection task, the work node 1 reports the operating parameter set of the work node 1 to the resource manager node. As another example, when the GPU 1 of the work node 1 finishes executing the wafer detection task, the work node 1 reports the operating parameter set of the work node 1 to the resource manager node.

As an example, the operation that the resource manager node determines the load value of each of the work nodes according to the operating parameter set of the work node includes: the resource manager node determines the load value of each of the work nodes according to the operating parameter set of the work node and a preset weight value set. The preset weight value set includes a weight coefficient for indicating the GPU utilization rate, the available video memory, the CPU utilization rate and the available memory.

Specifically, the resource manager node may determine the load value of each of the work nodes through the following formula.

$$L_x = f_{GPU} \frac{\sum_{i=1}^{k} U_{GPU}^i}{k} + f_{VRAM} \frac{k}{\sum_{i=1}^{k} A_{VRAM}^i} + f_{CPU} U_{CPU} + f_{RAM} \frac{1}{A_{RAM}}$$

Where $L_x$ represents the load value of an xth work node, $x \in (1, 2, \ldots, n)$, and n is a positive integer greater than or equal to 2.

$U^i_{GPU}$ represents the GPU utilization of an ith GPU of the xth work node, $$\frac{\sum_{i=1}^{k} U_{GPU}^i}{k}$$

represents the average GPU utilization rate of all GPUs of the xth work node, where $i \in (1, 2, \ldots, k)$, and k is a positive integer greater than or equal to 2.

$A^i_{VRAM}$ represents available video memory capacity of the ith GPU of the xth work node, $U_{CPU}$ represents the CPU utilization rate of the xth work node, and ARAM represents available memory capacity of the xth work node.

$f_{GPU}$ represents the weight coefficient of the GPU utilization rate, $f_{VRAM}$ represents the weight coefficient of the available video memory, $f_{CPU}$ represents the weight coefficient of the CPU utilization rate, and $f_{RAM}$ represents the weight coefficient of the available memory.

In an embodiment of the present disclosure, the above operation S302 includes: the resource manager node receives the load value from each of the work nodes, the load value of each of the work nodes is determined by the work node according to the operating parameter set. The work node of the above example directly reports the load value thereof to the resource manager node, so that calculation amount of the resource manager node may be reduced, part of calculation resources are saved, and the processing performance of the resource manager node may be improved.

In S303, the resource manager node determines the weight value of each of the work nodes according to load values of the plurality of work nodes, the load value of each of the work nodes is negatively correlated with the weight value of the work node, namely, the greater the load value of the work node is, the smaller the weight value of the work node is; and the smaller the load value of the work node is, the greater the weight value of the work node is.

In an embodiment of the present disclosure, the above S303 includes: the resource manager node obtains load values of the plurality of work nodes, determines a load threshold according to the plurality of load values, and determines the weight value of each of the work nodes according to the load threshold and the load values of the plurality of work nodes. The load threshold indicates the average load magnitude of the plurality of work nodes. The load threshold is a dynamically changing threshold, and the resource manager node may calculate the load threshold T through the following formula.

$$T = \lambda \frac{\sum_{x=1}^{n} L_x}{n}$$

Where $\lambda$ is a coefficient, $\lambda \in [1, +\infty)$, and $\lambda$ is set as 2 by default.

In a possible case, if the resource manager node determines that the load value of a work node is greater than the load threshold $$\left( L_x < \lambda \frac{\sum_{x=1}^{n} L_x}{n} \right),$$

then the weight value of the work node is set as 1. The probability that a task is allocated to the work node is reduced to $$\frac{1}{\sum_{x=1}^{n} L_x},$$

and the work node in the above case is considered to be in a sub-health state which expresses that the load of the work node is too high, so that a new task is not allocated to the work node as much as possible, and the probability that the new task is allocated to the work node may be reduced.

In a possible case, the resource manager node determines that the load value of a work node is less than or equal to the load threshold $$\left( L_x \leq \lambda \frac{\sum_{x=1}^{n} L_x}{n} \right),$$

and the weight value of the work node is set as a number $w_x = N_{GPU}^x$ of the GPUs of the work node. The probability that the task is allocated to the work node is improved to $$\frac{N_{GPU}^x}{\sum_{x=1}^{n} L_x},$$

and the work node in the above case is considered to be in a healthy state which expresses that the load of the work node is relatively low, so it is preferable to allocate the new task to the work node, and the probability that the new task is allocated to the work node may be improved.

In addition to the above two cases, there is a special case that a connection relationship originally exists between the work node and the resource manager node, but due to a network problem or a device problem, the work node and the resource manager node are in a disconnection state, the work node is considered to be in an unhealthy state, the resource manager node does not consider allocating the new task to the work node anymore, and the weight value of the work node may be set as 0.

In a possible implementation, the resource manager node may periodically calculate the load threshold to obtain the latest load threshold, and adjusts the weight value of each of the work nodes based on the load threshold. The implementation occupies fewer resources of the resource manager node, but the updating of the weight value of each of the work nodes is not timely enough.

In another possible implementation, after receiving the load information reported by the work nodes (as long as one work node reports updated load information), the resource manager node recalculates the load threshold to obtain an updated load threshold, and adjusts the weight value of each of the work nodes based on the load threshold. In the implementation, the weight value of each of the work nodes is updated timely, but many resources are occupied.

In S304, the resource manager node determines a target work node according to the weight values of the work nodes.

In S305, the resource manager node sends the wafer detection task to the target work node.

In S306, the target work node determines an idle GPU.

In S307, the target work node sends the wafer detection task to the GPU.

In S308, the GPU executes the wafer detection task.

Operations S304 to S308 of the embodiment are the same as operations S102 to S106 of the above embodiment, and reference may be made specifically to the above embodiment, the operations will not be described in detail herein.

According to the method for processing wafer detection tasks provided by the embodiment of the present disclosure, the resource manager node receives the wafer detection task from the storage server, obtains the weight value of each of the work nodes and the current load threshold, and adjusts the weight value of each of the work nodes by comparing a magnitude relationship between the weight value of the work node and the current load threshold. The target work node is selected from the plurality of work nodes according to the weight values of the work nodes, and the wafer detection task is allocated to the target work node. The target work node selects the idle GPU from the plurality of GPUs and allocates the wafer detection task to the idle GPU for execution. Through the above two-stage task scheduling, the wafer detection tasks are scattered to the GPUs of the work nodes for execution, load balance between the work nodes and between the GPUs is realized, a real-time requirement for performing defect detection on a large number of wafer maps may be met, and the throughput for processing the wafer detection task by the system is improved.

According to an embodiment of the present disclosure, the device may be divided into function modules according to the above method embodiments, for example, each function module may be divided corresponding to each function, and two or more functions may be integrated into one processing module. The above integrated module may be implemented either in hardware or in a software function module. It is to be noted that the division of the modules in the embodiment of the present disclosure is illustrative and is merely of logical function division, and that additional division manners may be possible for practical implementation. An example of dividing each function module corresponding to each function is described below.

Figure 7:
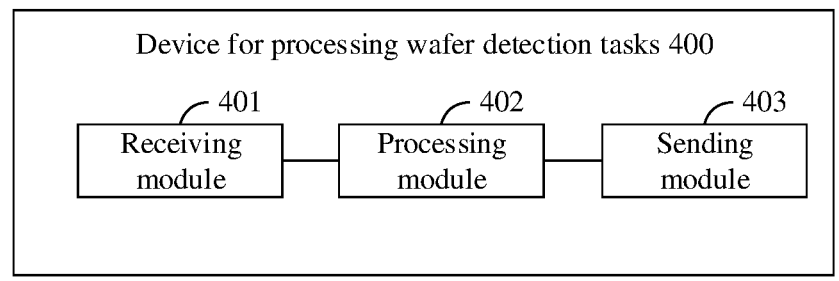
FIG. 7 is a structural schematic diagram of a device for processing wafer detection tasks provided by an embodiment of the present disclosure.

FIG. 7 is a structural schematic diagram of a device for processing wafer detection tasks provided by an embodiment of the present disclosure. As shown in FIG. 7, the device 400 for processing wafer detection tasks of the embodiment is connected to a plurality of work nodes. The device includes a receiving module 401, a processing module 402, and a sending module 403.

The receiving module 401 is configured to receive a wafer detection task from a storage server, herein the wafer detection task includes at least one wafer map.

The processing module 402 is configured to determine, according to weight values of the work nodes, a target work node, herein the target work node is a work node with a greatest weight value in the plurality of work nodes, and a weight value of each of the work nodes is a parameter, determined according to load information of each of the work nodes, for allocating the wafer detection tasks.

The sending module 403 is configured to send the wafer detection task to the target work node.

In an embodiment of the present disclosure, before determining, according to the weight values of the work nodes, the target work node, the processing module 402 is further configured to perform the following operations.

A load value of each of the work node is obtained, the load value indicates a load magnitude of the work node in a preset time period.

The weight value of each of the work nodes is determined according to load values of the plurality of work nodes, the load magnitude of each of the work nodes is negatively correlated with the weight value of the work node.

In an embodiment of the present disclosure, the receiving module 401 is further configured to receive an operating parameter set from each of the work nodes, herein the operating parameter set includes at least one of GPU utilization rates of a plurality of GPUs of the work node, available video memories of the plurality of GPUs of the work node, a CPU utilization rate of the work node, or an available memory of the work node.

The processing module 402 is further configured to determine, according to the operating parameter set of each of the work nodes, the load value of the work node.

In an embodiment of the present disclosure, the receiving module 401 is further configured to receive the load value from each of the work nodes, herein the load value of each of the work nodes is determined by the work node according to an operating parameter set.

In an embodiment of the present disclosure, the processing module 402 is specifically configured to perform the following operations.

The load value of each of the work node is determined according to the operating parameter set of the work node and a preset weight value set, the load value of the work node, herein the preset weight value set includes a weight coefficient for indicating the GPU utilization rate, the available video memory, the CPU utilization rate and the available memory.

In an embodiment of the present disclosure, the receiving module 401 is specifically configured to perform the following operations.

The operating parameter set from each of the work nodes is periodically received.

Or, responsive to start or end of execution of a wafer detection task for each of the work nodes, the operating parameter set from the work node is received.

In an embodiment of the present disclosure, the processing module 402 is specifically configured to perform the following operations.

Load values of the plurality of work nodes are obtained.

A load threshold is determined according to the plurality of load values, herein the load threshold indicates an average load magnitude of the plurality of work nodes.

The weight value of each of the work nodes is determined according to the load threshold and the load values of the plurality of work nodes.

In an embodiment of the present disclosure, the processing module 402 is specifically configured to perform the following operations.

A weight value of a work node with the load value greater than the load threshold is set as 1.

Or, a weight value of a work node with the load value smaller than or equal to the load threshold is set as a number of GPUs of the work node.

The device provided by the embodiments of the present disclosure is configured to execute each operation of the resource manager node in any foregoing method embodiment, an implementation principle and a technical effect are similar and will not be described in detail herein.

Figure 8:
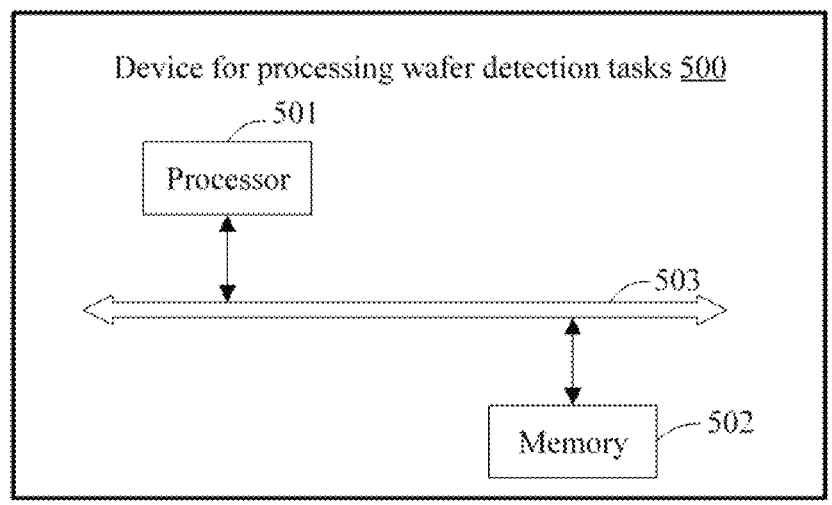
FIG. 8 is a hardware schematic diagram of a device for processing wafer detection tasks provided by an embodiment of the present disclosure.

FIG. 8 is a hardware schematic diagram of a device for processing wafer detection tasks provided by an embodiment of the present disclosure. As shown in FIG. 8, the device 500 for processing wafer detection tasks of the embodiment includes:

at least one processor 501 (FIG. 8 only shows one processor); and a memory 502 in communication connection with the at least one processor.

The memory 502 stores instructions executable by the at least one processor 501, which, when being executed by the at least one processor 501, cause the device 500 to execute each operation of the resource manager node in any foregoing method embodiment.

Optionally, the memory 502 may be independent and may also be integrated with the processor 501.

When the memory 502 is a device independent of the processor 501, the device 500 further includes a bus 503, configured to connect the memory 502 and the processor 501.

The present disclosure further provides a computer-readable storage medium. The computer-readable storage medium stores computer execution instructions, which, when being executed by a processor, cause the processor to implement the technical solution of the resource manager node in any foregoing method embodiment.

The present disclosure further provides a system for wafer detection. Referring to FIG. 1, the system includes at least one resource manager node, and a plurality of work nodes connected to the resource manager node.

Each of the work nodes includes a plurality of GPUs. The resource manager node is configured to execute each operation of the resource manager node in any foregoing method embodiment.

In an embodiment of the present disclosure, each of the work nodes is configured to, after receiving a wafer detection task sent by the resource manager node, select an idle GPU from the plurality of GPUs of the work node and allocate the wafer detection task to the idle GPU for execution. The GPU is configured to execute the wafer detection task.

In an embodiment of the disclosure, the GPU includes a wafer detection model. The wafer detection model is obtained through training by adopting a depth learning model and is configured to detect whether a wafer in each wafer map in the wafer detection task has a defect, and detect a defect category and a defect position.

The system for wafer detection provided by the embodiments of the present disclosure is a detection system of a distributed architecture based on a GPU cluster, may realize real-time detection for a large number of wafer maps generated by a defect detection machine table, may assist a production department to quickly lock the defect detection machine table with a problem, is beneficial to finding out a manufacture procedure problem early, responding to manufacture procedure deviation timely and greatly reducing the detection cost for finding out the problem machine table, and may improve the manufacture procedure yield and reduce the production cost.

It will be appreciated that the processor mentioned in the embodiments of the present disclosure may be a CPU, and may also be other general purpose processor, a Digital Signal Processor (DSP), an Application Specific Integrated Circuit (ASIC), a Field Programmable Gate Array (FPGA) or other programmable logic device, a discrete gate or a transistor logic device, a discrete hardware component, etc. The general purpose processor may be a microprocessor or the processor may also be any conventional processor, etc.

It will further be appreciated that the memory mentioned in the embodiment of the present disclosure may be a volatile memory or a nonvolatile memory, or may include both the volatile memory and the nonvolatile memory. The nonvolatile memory may be a Read-Only Memory (ROM), a Programmable ROM (PROM), an Erasable PROM (EPROM), and an Electrically PROM (EEPROM), or a flash memory. The volatile memory may be a Random Access Memory (RAM), which is used as an external cache. By exemplary and not restrictive illustration, many forms of RAM are available, for example, a Static RAM (SRAM), a Dynamic RAM (DRAM), a Synchronous DRAM (SDRAM), a Double Data Rate Synchronous DRAM (DDR SDRAM), an Enhanced SDRAM (ESDRAM), a Synchlink DRAM (SLDRAM), and a Direct Rambus RAM (DR RAM).

It is to be noted that when the processor is the general purpose processor, the DSP, the ASIC, the FPGA or other programmable logic device, the discrete gate or transistor logic device, or the discrete hardware component, the memory (a storage module) is integrated into the processor.

It is to be understood that the memory described herein is intended to include, but be not limited to, these and any other suitable type of memory.

It will be appreciated that in various embodiments of the present disclosure, the magnitude of serial numbers in each above procedure is not meant to imply an order of execution.

The order of execution of each process should be determined by a function and inherent logic thereof, and should not be construed as any limitation of an implementation procedure of the embodiment of the present disclosure.

The above description is only specific embodiments of the present disclosure, but the scope of protection of the present disclosure is not limited herein. Any changes or substitutions that may be easily made by those skilled in the art within the technical scope disclosed in the present disclosure should be included within the scope of protection of the present disclosure. Therefore, the scope of protection of the present disclosure should be determined by the appended claims.

The invention claimed is:

1. A method for processing wafer detection tasks, applied to a resource manager node connected to a plurality of work nodes, the method comprising:
  receiving a wafer detection task from a storage server, wherein the wafer detection task comprises at least one wafer map;
  obtaining a load value of each of the plurality of work nodes, wherein the load value indicates a load magnitude of the work node in a preset time period;
  determining, according to load values of the plurality of work nodes, a weight value of each of the plurality of work nodes, wherein the load magnitude of each of the plurality of work nodes is negatively correlated with the weight value of the work node;
  determining, according to the weight values of the plurality of work nodes, a target work node, wherein the target work node is a work node with a greatest weight value in the plurality of work nodes, and a weight value of each of the plurality of work nodes is a parameter, determined according to load information of each of the plurality of work nodes, for allocating the wafer detection tasks; and
  sending the wafer detection task to the target work node.

2. The method of claim 1, wherein the obtaining the load value of each of the plurality of work nodes comprises:
  receiving an operating parameter set from each of the plurality of work nodes, wherein the operating parameter set comprises at least one of Graphics Processing Unit (GPU) utilization rates of a plurality of GPUs of the work node, available video memories of the plurality of GPUs of the work node, a Central Processing Unit (CPU) utilization rate of the work node, or an available memory of the work node; and
  determining, according to the operating parameter set of each of the plurality of work nodes, the load value of the work node.

3. The method of claim 1, wherein the obtaining the load value of each of the plurality of work nodes comprises:
  receiving the load value from each of the plurality of work nodes, wherein the load value of each of the plurality of work nodes is determined by the work node according to an operating parameter set.

4. The method of claim 2, wherein the determining, according to the operating parameter set of each of the plurality of work nodes, the load value of the work node comprises:
  determining, according to the operating parameter set of each of the plurality of work nodes and a preset weight value set, the load value of the work node, wherein the preset weight value set comprises a weight coefficient for indicating the GPU utilization rate, the available video memory, the CPU utilization rate and the available memory.

5. The method of claim 2, wherein the receiving the operating parameter set from each of the plurality of work nodes comprises:
  receiving the operating parameter set from each of the plurality of work nodes periodically; or
  responsive to start or end of execution of a wafer detection task for each of the plurality of work nodes, receiving the operating parameter set from the work node.

6. The method of claim 1, wherein the determining, according to the load values of the plurality of work nodes, the weight value of each of the plurality of work nodes comprises:
  obtaining the load values of the plurality of work nodes;
  determining, according to the plurality of load values, a load threshold, wherein the load threshold indicates an average load magnitude of the plurality of work nodes; and
  determining, according to the load threshold and the load values of the plurality of work nodes, the weight value of each of the plurality of work nodes.

7. The method of claim 6, wherein the determining, according to the load threshold and the load values of the plurality of work nodes, the weight value of each of the plurality of work nodes comprises:
  setting a weight value of a work node with the load value greater than the load threshold as 1; or
  setting a weight value of a work node with the load value smaller than or equal to the load threshold as a number of Graphic Processing Units (GPUs) of the work node.

8. A device for processing wafer detection tasks, comprising:
  at least one processor; and
  a memory in communication connection with the at least one processor, configured to store instructions executable by the at least one processor,
  wherein the at least one processor is configured to:
    receive a wafer detection task from a storage server, wherein the wafer detection task comprises at least one wafer map;
    obtain a load value of each of the plurality of work nodes, wherein the load value indicates a load magnitude of the work node in a preset time period;
    determine, according to load values of the plurality of work nodes, a weight value of each of the plurality of work nodes, wherein the load magnitude of each of the plurality of work nodes is negatively correlated with the weight value of the work node;
    determine, according to the weight values of the plurality of work nodes, a target work node, wherein the target work node is a work node with a greatest weight value in the plurality of work nodes, and a weight value of each of the plurality of work nodes is a parameter, determined according to load information of each of the plurality of work nodes, for allocating the wafer detection tasks; and
    send the wafer detection task to the target work node.

9. The device of claim 8, wherein the at least one processor is configured to:
  receive an operating parameter set from each of the plurality of work nodes, wherein the operating parameter set comprises at least one of Graphics Processing Unit (GPU) utilization rates of a plurality of GPUs of the work node, available video memories of the plurality of GPUs of the work node, a Central Processing Unit (CPU) utilization rate of the work node, or an available memory of the work node; and determine, according to the operating parameter set of each of the plurality of work nodes, the load value of the work node.

10. The device of claim 8, wherein the at least one processor is configured to:
receive the load value from each of the plurality of work nodes, wherein the load value of each of the plurality of work nodes is determined by the work node according to an operating parameter set.

11. The device of claim 9, wherein the at least one processor is configured to:
determine, according to the operating parameter set of each of the plurality of work nodes and a preset weight value set, the load value of the work node, wherein the preset weight value set comprises a weight coefficient for indicating the GPU utilization rate, the available video memory, the CPU utilization rate and the available memory.

12. The device of claim 9, wherein the at least one processor is configured to:
receive the operating parameter set from each of the plurality of work nodes periodically; or
responsive to start or end of execution of a wafer detection task for each of the plurality of work nodes, receive the operating parameter set from the work node.

13. The device of claim 8, wherein the at least one processor is configured to:
obtain the load values of the plurality of work nodes;
determine, according to the plurality of load values, a load threshold, wherein the load threshold indicates an average load magnitude of the plurality of work nodes; and
determine, according to the load threshold and the load values of the plurality of work nodes, the weight value of each of the plurality of work nodes.

14. The device of claim 13, wherein the at least one processor is configured to:
set a weight value of a work node with the load value greater than the load threshold as 1; or
set a weight value of a work node with the load value smaller than or equal to the load threshold as a number of Graphic Processing Units (GPUs) of the work node.

15. A system for wafer detection, comprising:
at least one resource manager node, and a plurality of work nodes connected to the resource manager node, wherein each of the plurality of work nodes comprises a plurality of Graphics Processing Units (GPUs); and
wherein the resource manager node is configured to:
receive a wafer detection task from a storage server, wherein the wafer detection task comprises at least one wafer map;
obtain a load value of each of the plurality of work nodes, wherein the load value indicates a load magnitude of the work node in a preset time period;
determine, according to load values of the plurality of work nodes, a weight value of each of the plurality of work nodes, wherein the load magnitude of each of the plurality of work nodes is negatively correlated with the weight value of the work node;
determine, according to the weight values of the plurality of work nodes, a target work node, wherein the target work node is a work node with a greatest weight value in the plurality of work nodes, and a weight value of each of the plurality of work nodes is a parameter, determined according to load information of each of the plurality of work nodes, for allocating the wafer detection tasks; and
send the wafer detection task to the target work node.

16. The system of claim 15, wherein each of the plurality of work nodes is configured to, after receiving a wafer detection task sent by the resource manager node, select an idle GPU from the plurality of GPUs of the work node and allocate the wafer detection task to the idle GPU for execution.

17. The system of claim 15, wherein the resource manager node is configured to:
receive an operating parameter set from each of the plurality of work nodes, wherein the operating parameter set comprises at least one of GPU utilization rates of a plurality of GPUs of the work node, available video memories of the plurality of GPUs of the work node, a Central Processing Unit (CPU) utilization rate of the work node, or an available memory of the work node; and
determine, according to the operating parameter set of each of the plurality of work nodes, the load value of the work node.

* * * * *